United States Patent
Groves et al.

(10) Patent No.: US 9,570,233 B2
(45) Date of Patent: Feb. 14, 2017

(54) HIGH-Q MULTIPATH PARALLEL STACKED INDUCTOR

(71) Applicant: GLOBALFOUNDRIES INC., Grand Cayman (KY)

(72) Inventors: Robert A. Groves, Highland, NY (US); Venkata Nr. Vanukuru, Bangalore (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 76 days.

(21) Appl. No.: 14/304,598

(22) Filed: Jun. 13, 2014

(65) Prior Publication Data

US 2015/0364248 A1 Dec. 17, 2015

(51) Int. Cl.
| | |
|---|---|
| H01F 5/00 | (2006.01) |
| H01F 27/28 | (2006.01) |
| H01F 41/04 | (2006.01) |
| H01F 17/00 | (2006.01) |

(52) U.S. Cl.
CPC .......... *H01F 41/04* (2013.01); *H01F 17/0033* (2013.01); *H01F 41/041* (2013.01); *H01F 2017/0053* (2013.01)

(58) Field of Classification Search
CPC .................................. H01F 5/00; H01F 27/28
USPC .................................................. 336/200, 232
See application file for complete search history.

(56) References Cited

U.S. PATENT DOCUMENTS

| | | | | |
|---|---|---|---|---|
| 5,559,360 A | * | 9/1996 | Chiu | H01F 17/0006 257/531 |
| 6,549,112 B1 | | 4/2003 | Gallina et al. | |
| 7,312,685 B1 | * | 12/2007 | Lee | H01F 17/0013 336/200 |

(Continued)

FOREIGN PATENT DOCUMENTS

| | | | |
|---|---|---|---|
| JP | 06061071 A | * | 3/1994 |
| JP | 2003257740 A | * | 9/2003 |
| WO | WO2009128047 A1 | | 10/2009 |

OTHER PUBLICATIONS

Athreya, D., et al. "Ultra High Q Embedded Inductors in Highly Miniaturized Family of Low Loss Organic Substrates" 2008 Electronic Components and Technology Conference. May 2008. pp. 2073-2080.

(Continued)

*Primary Examiner* — Tsz Chan
(74) *Attorney, Agent, or Firm* — Anthony Canale; Hoffman Warnick, LLC

(57) ABSTRACT

A parallel stacked multipath inductor includes a first layer including turns disposed about a center region, the turns on the first layer having segments that extend length-wise along the turns, the segments having positions that vary from an innermost position relative to the center region and an outermost position relative to the center region. A second layer includes turns electrically connected to the first layer along its length and disposed about the center region, the turns on the second layer having segments that extend length-wise along the turns, the segments having positions (Continued)

that vary from an innermost position and an outermost position relative to the center region. Cross-over architectures are configured to couple the segments on the first layer with the segments on the second layer to form segment paths that have a substantially same length for all segment paths per turn between the first and second layers.

17 Claims, 12 Drawing Sheets

(56) References Cited

U.S. PATENT DOCUMENTS

| | | | |
|---|---|---|---|
| 7,370,403 B1* | 5/2008 | Hsu | H01F 17/0006 29/602.1 |
| 7,902,953 B1 | 3/2011 | Watt | |
| 8,302,287 B2 | 11/2012 | Lu et al. | |
| 8,325,001 B2 | 12/2012 | Huang et al. | |
| 8,358,192 B2 | 1/2013 | Kireev et al. | |
| 8,505,193 B2 | 8/2013 | Papananos | |
| 2009/0273429 A1* | 11/2009 | Nakamura | H01F 17/0006 336/200 |
| 2011/0133877 A1* | 6/2011 | Chiu | H01F 17/0013 336/200 |
| 2013/0200969 A1 | 8/2013 | Singh et al. | |
| 2013/0200976 A1 | 8/2013 | Singh et al. | |
| 2013/0328164 A1* | 12/2013 | Cheng | H01L 28/10 257/531 |

OTHER PUBLICATIONS

Bae, H., et al. "Cost Effective Parallel-Branch Spiral Inductor With Enhanced Quality Factor and Resonance Frequency" 2007 Topical Meeting on Silicon Monolithic Integrated Circuits in RF Systems. Jan. 2007. pp. 87-90.

Belfiore, G., et al. "New Design Approach of Vertical Inductors for High-Frequency Integrated Circuits" 2013 SBMO/IEEE MTT-S International Microwave & Optoelectronics Conference (IMOC). Aug. 2013. (4 Pages).

Cai, H., et al. "Application of Ferrite Nanomaterial in RF On-Chip Inductors" Journal of Nanomaterials, vol. 2013. (Apr. 2013) pp. 1-12.

Chen, J., et al. "On-Chip Spiral Inductors for RF Applications: An Overview" Journal of Semiconductor Technology and Science, vol. 4, No. 3. Sep. 2004. pp. 149-167.

Chen, W., et al. "Three-Dimensional Fully Symmetric Inductors, Transformer, and Balun in CMOS Technology" IEEE Transactions on Circuits and Systems—I. Regular Papers, vol. 54, No. 7. Jul. 2007. pp. 1413-1423.

Huang, W., et al. "On-Chip Inductors With Self-Rolled-Up SINx Nanomembrane Tubes: A Novel Design Platform for Extreme Miniaturization" Nano Letters. Nov. 2012. pp. 6283-6288.

Islam, A., et al. "Design and Optimization of Printed Circuit Board Inductors for Wireless Power Transfer System" Circuits and Systems, vol. 4. Nov. 2012. pp. 237-244.

Lopez-Villegas, J., et al. "Improvement of the Quality Factor of RF Integrated Inductors by Layout Optimization" IEEE Transactions on Microwave Theory and Techniques, vol. 48, No. 1. Jan. 2000. pp. 76-83.

Maruyama, T., et al. "Increase of Q-Factor of RF Magnetic Thin Film Inductor by Introducing Slit-Patterned Magnetic Thin Film and Multiline-Conductor Spiral Coil" IEEE Transactions on Magnetics, vol. 47, No. 10. Oct. 2011. pp. 3196-3199.

Tang, C., et al. "Miniature 3-D Inductors in Standard CMOS Process" IEEE Journal of Solid-State Circuits, vol. 7=37, No. 4. Apr. 2002. pp. 471-480.

Tiemeijer, L., et al. "Record Q Spiral Inductors in Standard CMOS" International Electron Devices Meeting, 2001. IEDM '01. Technical Digest. Dec. 2001. pp. 40.7.1-40.7.3.

Wu, C., et al. "Selective Metal Parallel Shunting Inductor and Its VCO Application" IEEE Transactions on Circuits and Systems—I: Regular Papers, vol. 52, No. 9. Sep. 2005. pp. 1811-1818.

Xu, X., et al. "Design of Novel High-Q-Factor Multipath Stacked On-Chip Spiral Inductors" IEEE Transactions on Electron Devices, vol. 59, No. 8. Aug. 2012. pp. 2011-2018.

Yin, W., et al. "Double-Level Spiral Inductors With Multiple-Via Interconnects on GaAs Substrates" IEEE Transactions on Magnetics, vol. 40, No. 3. May 2004. pp. 1756-1758.

Zolfaghari, A., et al. "Stacked Inductors and Transformers in CMOS Technology" IEEE Journal of Solid-State Circuits, vol. 36, No. 4. Apr. 2001. pp. 620-628.

Groves, R., et al. "High-Q Multipath Parallel Stacked Inductor" U.S. Appl. No. 14/242,425, filed Apr. 1, 2014. (44 Pages).

* cited by examiner

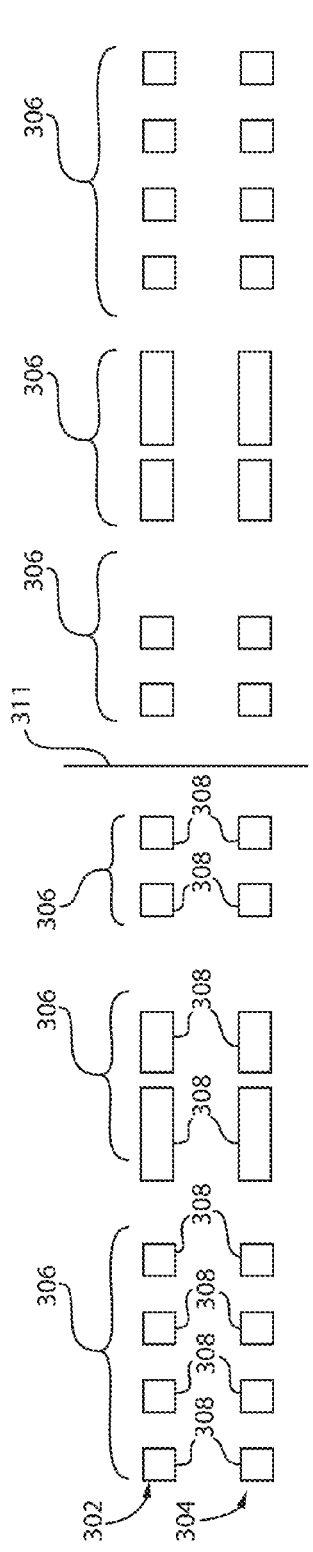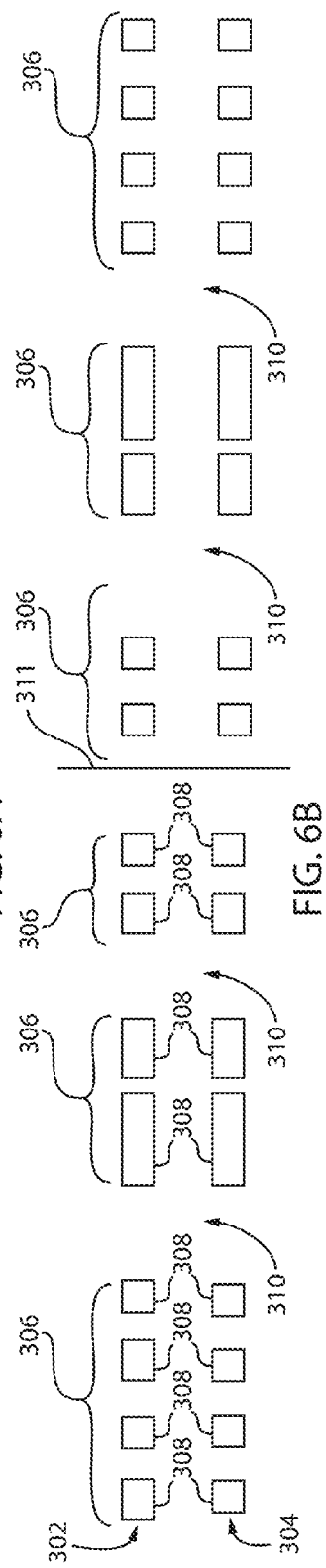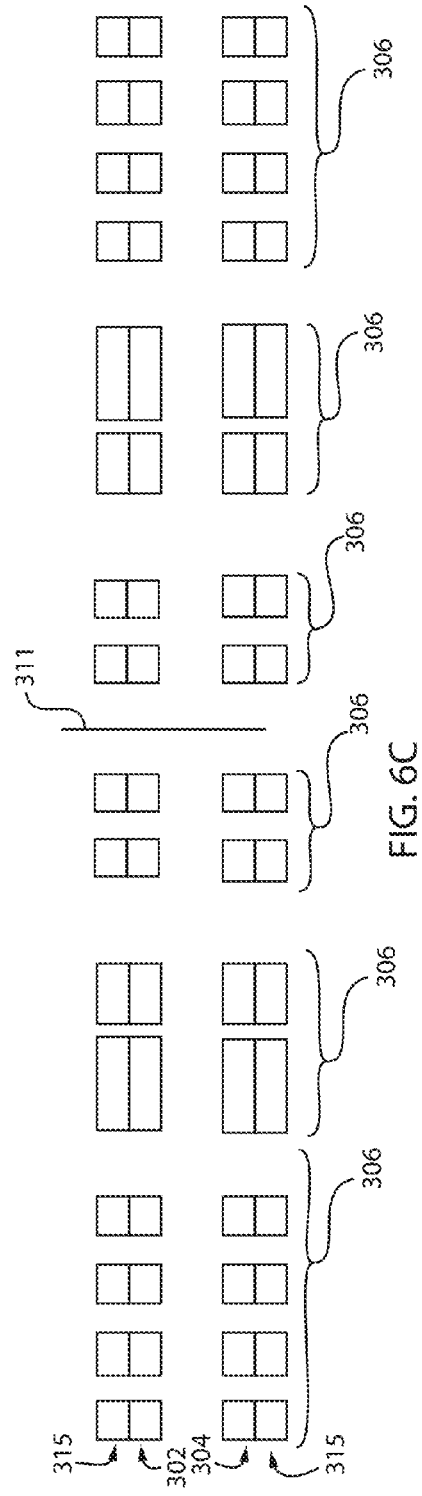

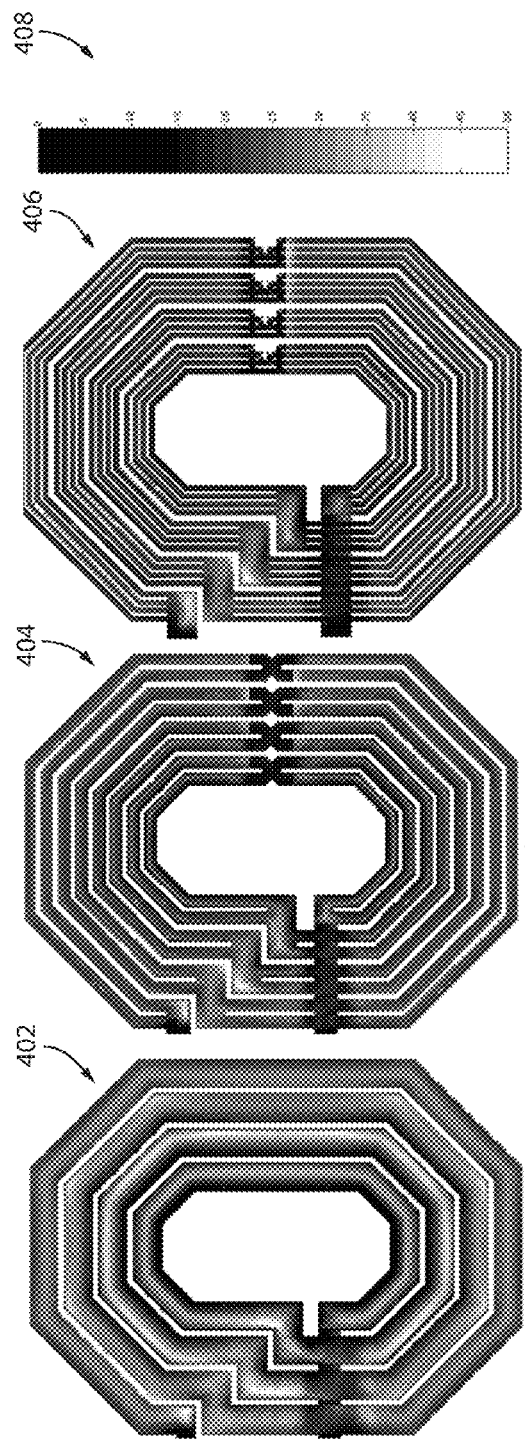
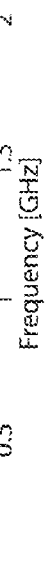
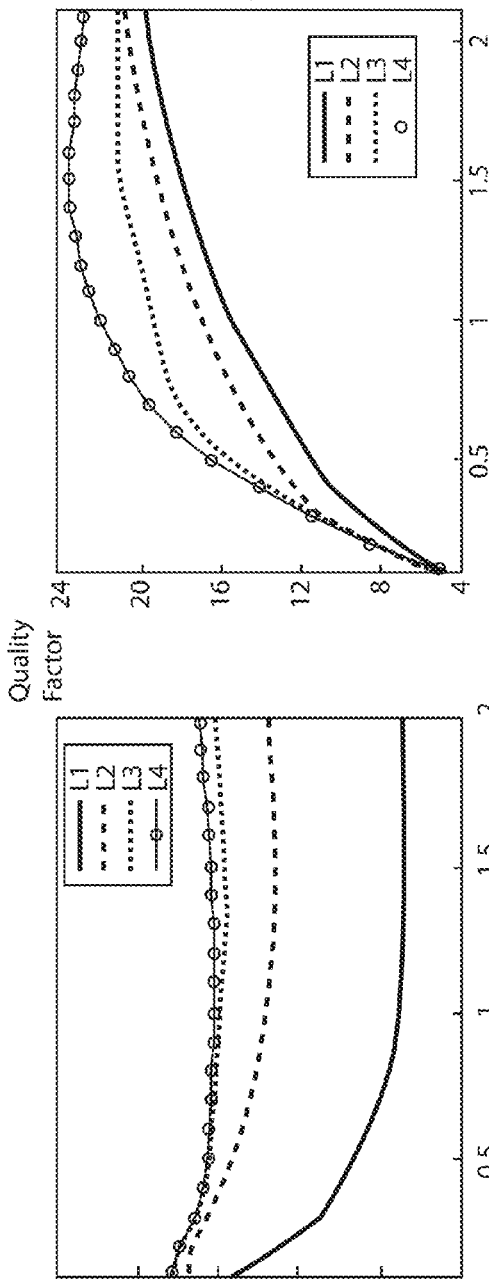
FIG. 8
FIG. 9A
FIG. 9B

HIGH-Q MULTIPATH PARALLEL STACKED INDUCTOR

RELATED APPLICATION DATA

This application is related to commonly assigned application Ser. No. 14/304,564 filed concurrently herewith and incorporated herein by reference.

BACKGROUND

Technical Field

The present invention relates to integrated circuits, and more particularly to three-dimensional integrated circuit inductor structures configured with high Q-factor for high frequency applications.

Description of the Related Art

With an increased demand for personal mobile communications, integrated semiconductor devices such as complementary metal oxide semiconductor (CMOS) devices may, for example, include voltage controlled oscillators (VCO), low noise amplifiers (LNA), tuned radio receiver circuits, or power amplifiers (PA). Each of these tuned radio receiver circuits, VCO, LNA, and PA circuits may, however, require on-chip inductor components in their circuit designs.

Several design considerations associated with forming on-chip inductor components may, for example, include quality factor (i.e., Q-factor), self-resonance frequency ($f_{SR}$), and cost considerations impacted by the area occupied by the formed on-chip inductor. Accordingly, for example, a CMOS radio frequency (RF) circuit design may benefit from, among other things, one or more on-chip inductors having a high Q-factor, a small occupied chip area, and a high $f_{SR}$ value. The $f_{SR}$ of an inductor may be given by the following equation:

$$f_{SR} = \frac{1}{2\pi\sqrt{LC}},$$

where L is the inductance value of the inductor and C may be the capacitance value associated with the inductor coil's inter-winding capacitance, the inductor coil's interlayer capacitance, and the inductor coil's ground plane (i.e., chip substrate) to coil capacitance. From the above relationship, a reduction in capacitance C may desirably increase the $f_{SR}$ of an inductor. One method of reducing the coil's ground plane to coil capacitance (i.e., metal to substrate capacitance) and, therefore, C value, is by using a high-resistivity semiconductor substrate such as a silicon-on-insulator (SOI) substrate. By having a high resistivity substrate (e.g., >50 Ω-cm), the effect of the coil's metal (i.e., coil tracks) to substrate capacitance is diminished, which in turn may increase the $f_{SR}$ of the inductor. Reducing the inductor coil's inter-winding and interlayer capacitance can similarly increase the $f_{SR}$ of the inductor.

The Q-factor of an inductor at frequencies well below $f_{SR}$ may be given by the equation:

$$Q = \frac{\omega L}{R},$$

where ω is the angular frequency, L is the inductance value of the inductor, and R is the resistance of the coil. As deduced from the above relationship, a reduction in coil resistance may lead to a desirable increase in the inductor's Q-factor. For example, in an on-chip inductor, by increasing the turn-width (i.e., coil track width) of the coil, R may be reduced in favor of increasing the inductors Q-factor to a desired value. In radio communication applications, the Q-factor value is set to the operating frequency of the communication circuit. For example, if a radio receiver is required to operate at 2 GHz, the performance of the receiver circuit may be optimized by designing the inductor to have a peak Q frequency value of about 2 GHz. The $f_{SR}$ and Q-factor of an inductor are directly related in the sense that by increasing $f_{SR}$, peak Q is also increased.

Skin effect is the tendency for high-frequency currents to flow on the surface of a conductor. Proximity effect is the tendency for current to flow in other undesirable patterns, e.g., loops or concentrated distributions, due to the presence of magnetic fields generated by nearby conductors. In transformers and inductors, proximity effect losses typically dominate over skin effect losses. Proximity and skin effects significantly complicate the design of efficient transformers and inductors operating at high frequencies.

In radio frequency tuned circuits used in radio equipment, proximity and skin effect losses in the inductor reduce the Q factor. To minimize this, special construction is used in radio frequency inductors. The winding is usually limited to a single layer, and often the turns are spaced apart to separate the conductors. In multilayer coils, the successive layers are wound in a crisscross pattern to avoid having wires lying parallel to one another.

SUMMARY

A parallel stacked multipath inductor includes a first layer including a plurality of turns disposed about a center region, the turns on the first layer having two or more segments that extend length-wise along the turns, the segments having positions that vary from an innermost position relative to the center region and an outermost position relative to the center region. A second layer includes a plurality of turns electrically connected to the first layer along its length and disposed about the center region, the turns on the second layer having two or more segments that extend length-wise along the turns, the segments having positions that vary from an innermost position relative to the center region and an outermost position relative to the center region. One or more cross-over architectures are configured to couple the segments of each turn on the first layer with the segments on each turn of the second layer to form segment paths that have a substantially same length for all segment paths per turn between the first and second layers.

A parallel stacked multipath inductor includes a first layer including a plurality of turns disposed about a center region, the turns on the first layer having two or more segments that extend length-wise along the turns, the segments having positions that vary from an innermost position relative to the center region and an outermost position relative to the center region. A second layer includes a plurality of turns electrically connected to the first layer by a plurality of via connections along its length and disposed about the center region, the turns on the second layer having two or more segments that extend length-wise along the turns, the segments having positions that vary from an innermost position relative to the center region and an outermost position relative to the center region. The turns include one or more of a width that varies with distance from the center region, a spacing that varies with distance from the center region and/or a segment number that varies with distance from the center region. One or more cross-over architectures are configured to couple the segments of each turn on the first layer with the segments on each turn of the second layer to form segment paths that have a substantially same length for all segment paths per turn between the first and second layers.

A method for fabricating a parallel stacked multipath inductor includes patterning a first metal layer to form spiral turns about a center region, the spiral turns including two or more segments that extend length-wise along the turns and having positions that vary from an innermost position relative to the center portion and an outermost position relative to the center portion; forming vias to connect sections of spiral turns between the first metal layer and the second metal layer and at least one cross-over architecture configured to couple the segments of the first layer to the segments of a second layer to form segment paths that have a substantially same length for all segment paths per turn between the first layer and the second layer and patterning the second metal layer to form spiral turns about the center region, the spiral turns including two or more segments that extend length-wise along the turns and having positions that vary from an innermost position relative to the center portion and an outermost position relative to the center portion, the first layer and the second layer including corresponding geometry therebetween and are electrically connected together in parallel along the length except at cross-over and underpass locations.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 6A is a schematic cross-sectional view showing a 3D inductor structure having an upper layer and a lower layer with segments varying in size and number as a function of radial distance from a center region in accordance with the present principles;

FIG. 6B is a schematic cross-sectional view showing a 3D inductor structure having an upper layer and a lower layer with turn or segment spacings varying in size as a function of radial distance from a center region in accordance with the present principles;

FIG. 6C is a schematic cross-sectional view showing a 3D inductor structure having an upper layer and a lower layer each with an additional metal layer to reduce resistance in accordance with the present principles;

FIG. 8 shows current density plots for three illustrative inductor structures in accordance with the present principles;

FIG. 9A is a graph of inductance (nH) versus frequency (GHz) for inductor structures showing the effect of varied segment count on inductor characteristics in accordance with the present principles;

FIG. 9B is a graph of quality factor versus frequency (GHz) for inductor structures showing the effect of varied segment count on inductor characteristics in accordance with the present principles.

DETAILED DESCRIPTION OF PREFERRED EMBODIMENTS

Figure 1:
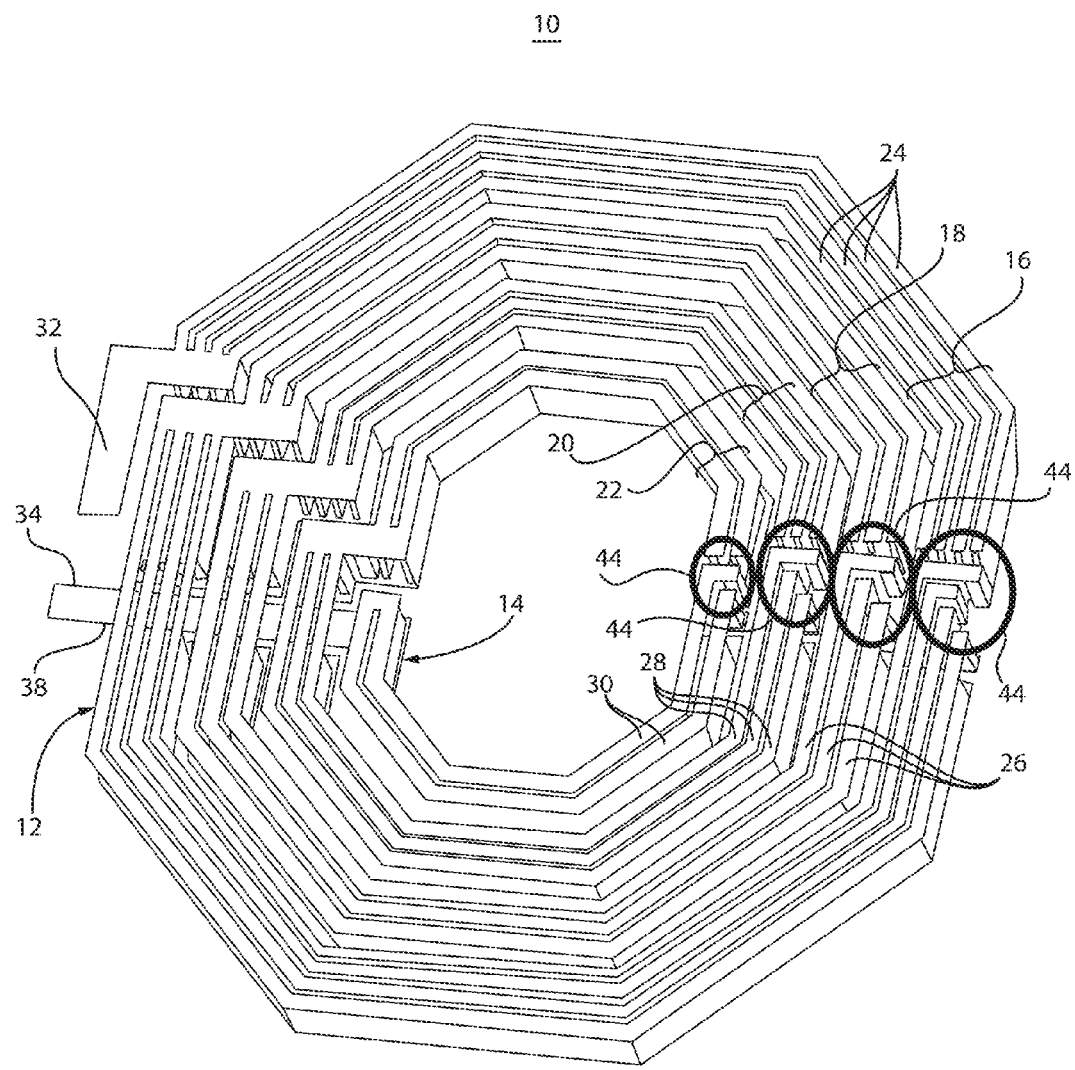
FIG. 1 is a perspective view of an illustrative parallel stacked multipath inductor in accordance with the present principles.

In accordance with the present principles, structures and methods for forming these structures are disclosed for three-dimensional (3D) inductors. The 3D inductors are preferably included on or with integrated circuits and more specifically may be formed on or in semiconductor devices. In particularly useful embodiments, the 3D inductors are employed in high speed applications, such as on or in radiofrequency (RF) devices and the like. In one embodiment, a 3D inductor structure includes an upper layer and one or more lower layers, which form paired spirals of upper and immediately adjacent lower lines. Both the upper and lower spirals are electrically connected throughout their length using multiple vias, except at cross-over and underpass locations. This configuration effectively increases the thickness of the spiral thereby reducing its resistance. Each spiral is divided into multiple segments. In some embodiments, the number and or size of segments is reduced from outer turn to inner turn.

The spirals employ a cross-over architecture, occurring one or more times per turn, to equalize the current flow through each segment. This is achieved by ensuring that the length of combined segments on different levels have a same overall length. In one embodiment, the cross-over architecture is employed on multiple metal levels to enable lateral connections of segments without shorting segments together.

Inductor structures with reduced skin and proximity effect losses are provided in accordance with the present principles, which increase the slope of Q characteristics thereby achieving higher Q values before the peak-Q frequency is reached.

In some embodiments, the inductor structure includes a parallel stacked winding for increased conductor thickness where spiral turns are divided into multiple strands or segments and interlevel cross-overs are provided to steer the current in such a way that all the path lengths are made equal to reduce skin and proximity effect losses. Moreover, the nature of the winding permits variable width and spacing for both the turns and segments, which further reduces the proximity effect losses.

In one embodiment, a 3D inductor structure includes an upper layer and one or more lower layers, which are divided into multiple parallel stacked segments, with the number of segments being reduced from outer turn to inner turn. Two or more bottom segments (including one or more parallel stacked metal layers) are connected in parallel with the vertically adjacent top segments (including one or more parallel stacked metal layers) and utilize a cross-over architecture, occurring one or more times per turn, to equalize the current flow through each segment within a turn. The cross-over architecture uses the multiple metal levels to enable lateral connection of segments without shorting segments together. Higher quality factor and increase current handling are provided.

It is to be understood that the present invention will be described in terms of a given illustrative architecture implemented on silicon; however, other architectures, structures, substrate materials and process features and steps may be varied within the scope of the present invention.

It is to be understood that the present invention will be described in terms of a given illustrative architecture formed on a wafer and integrated into a solid state device or chip; however, other architectures, structures, materials and process features and steps may be varied within the scope of the present invention. The terms coils, inductors and windings may be employed interchangeably throughout the disclosure. It should also be understood that these structures may take on any useful shape including rectangular, circular, oval, square, polygonal, etc.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip in accordance with the present principles may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a parallel stacked inductor 10 is illustratively shown having two levels 12 and 14. The two levels 12, 14 will be referred to as upper and lower levels for ease of explanation, it should be understood that the levels may be provided in any orientation (e.g., reversed, vertically disposed, etc.) and still function in accordance with the present principles.

The upper level or layer 12 is illustratively depicted having turns 16, 18, 20 and 22. Each turn 16, 18, 20 and 22 includes one or more segments (or strands) 24, 26, 28 and 30. In the illustrative embodiments shown, the outermost turn 16 includes four segments 24. The next turn 18 includes three segments 26. The next turn 20 includes three segments 28. The innermost turn 22 includes two segments 30. In one embodiment, the amount of conductive material increases for each turn and/or segment as radius or distance from a center of the device 10 increases. This may include adding additional segments or strands or making the strands larger (wider or thicker) or both.

The device 10 includes input connections or pads 32 and 34, which connect to end portions of the coil or device 10. Pad 34 represents an end connection of a conductive structure 38. The conductive structure 38 may be placed on a different metal layer or a same metal layer as the lower level 14, in which case it is connected to layer 14 through a via (not shown).

The lower level or layer 14 includes a substantially corresponding turn and segment structure as that of the upper layer 12. In this way, the number of turns and the number of segments per turn are the same but connected differently. For this embodiment, the turns 16, 18, 20 and 22 and segments (or strands) 24, 26, 28 and 30 have a substantially corresponding structure on the lower level 14 except for the end connection 38 that cuts across the lower layer 14. The upper level 12 and the lower level 14 are connected using cross-over architectures or cross-over points 44. The upper level 12 and the lower level 14 are also connected throughout their lengths electrically in parallel with vias, everywhere except at cross-over architectures 44 and potentially the cross-over connection 38 (which may be placed on an additional layer to avoid cutting across the turns). The cross-over architectures 44 provide equal lengths for segment pairs between the upper and lower levels 12, 14. Since the segments on an inside of a coil are smaller in length than the segments of the outer portion of the coil, the cross-over architecture 44 connects segment pairs to provide equal lengths of segment pairs between levels, e.g., a longest segment on the upper level to a shortest segment on the lower level, and the shortest segment on the upper level to the longest segment on the lower level. Long intermediary segments on the upper level are connected to short intermediary segments on the lower level, and short intermediary segments on the upper level are connected to long intermediary segments on the lower level. In this way, a total length of each segment pair is equal. The cross-over connections occur at the cross-over architecture or points 44. The cross-over points 44 may occur one or more times per turn.

Figure 2A:
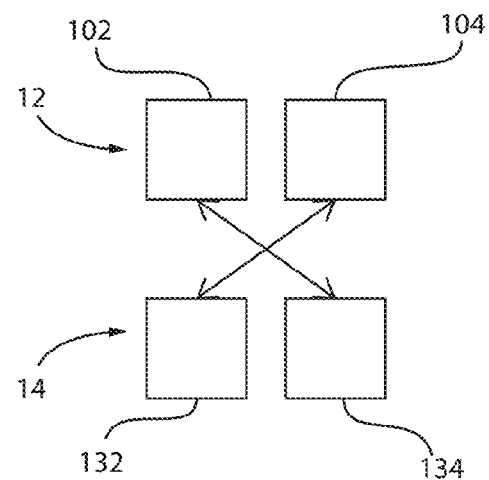
FIG. 2A is a cross-section diagram showing segment connections for turns with two segments in accordance with the present principles.
Figure 2B:
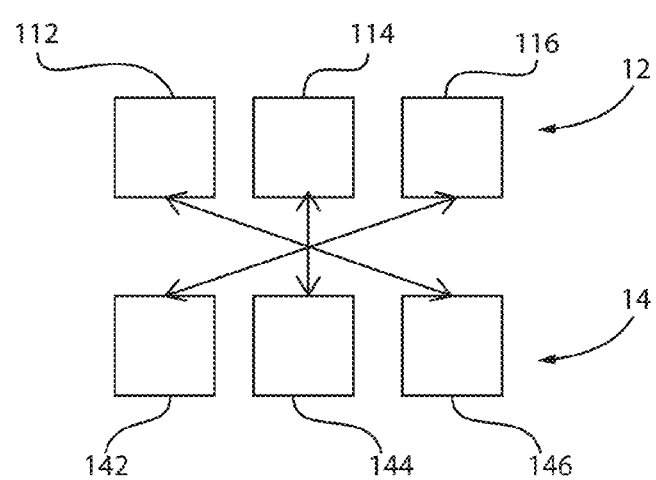
FIG. 2B is a cross-section diagram showing segment connections for turns with three segments in accordance with the present principles.
Figure 2C:
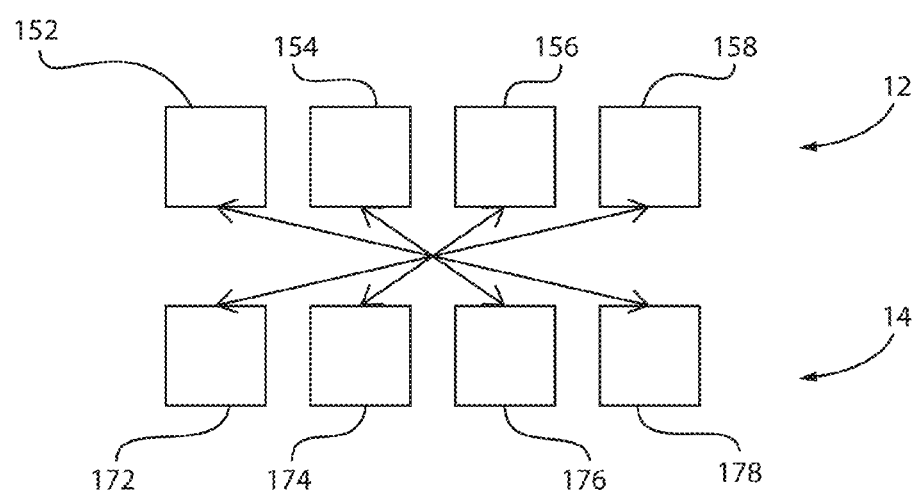
FIG. 2C is a cross-section diagram showing segment connections for turns with four segments in accordance with the present principles.

Referring to FIGS. 2A-2C, cross-section diagrams show possible connection schemes for cross-over architectures for a two layer parallel inductor coil in accordance with illustrative embodiments. FIG. 2A shows a cross-sectional view of a two segment turn having two segments 102 and 104 on level 12 and two segments 132 and 134 on a level 14. The segment 102 (e.g., outermost segment on level 12) is connected to segment 134 (e.g., the innermost segment on level 14) to form a segment pair. The segment 104 (e.g., innermost segment on level 12) is connected to segment 132 (e.g., the outermost segment on level 14) to form another segment pair. The two segment pairs include the same length.

FIG. 2B shows a cross-sectional view of a three segment turn having three segments 112, 114 and 116 on level 12 and three segments 142, 144 and 146 on a level 14. The segment 112 (e.g., outermost segment on level 12) is connected to segment 146 (e.g., the innermost segment on level 14) to form a segment pair. The intermediary segments 114 and 144 on levels 12 and 14 respectively are connected to form another segment pair. The segment 116 (e.g., innermost segment on level 12) is connected to segment 142 (e.g., the outermost segment on level 14) to form another segment pair. The three segment pairs include the same length.

FIG. 2C shows a cross-sectional view of a four segment turn having four segments 152, 154, 156 and 158 on level 12 and four segments 172, 174, 176 and 178 on a level 14. The segment 152 (e.g., outermost segment on level 12) is connected to segment 178 (e.g., the innermost segment on level 14) to form a segment pair. An outer intermediary segment 154 on level 12 connects to an inner intermediary segment 176 on level 14 to form another segment pair. An inner intermediary segment 156 on level 12 connects to an outer intermediary segment 174 on level 14 to form another segment pair. The segment 158 (e.g., innermost segment on level 12) is connected to segment 172 (e.g., the outermost segment on level 14) to form another segment pair. The four segment pairs include the same length. While illustrative configurations are shown for two, three and four segments, a greater number of segments are contemplated in accordance with the present principles.

Figure 3:
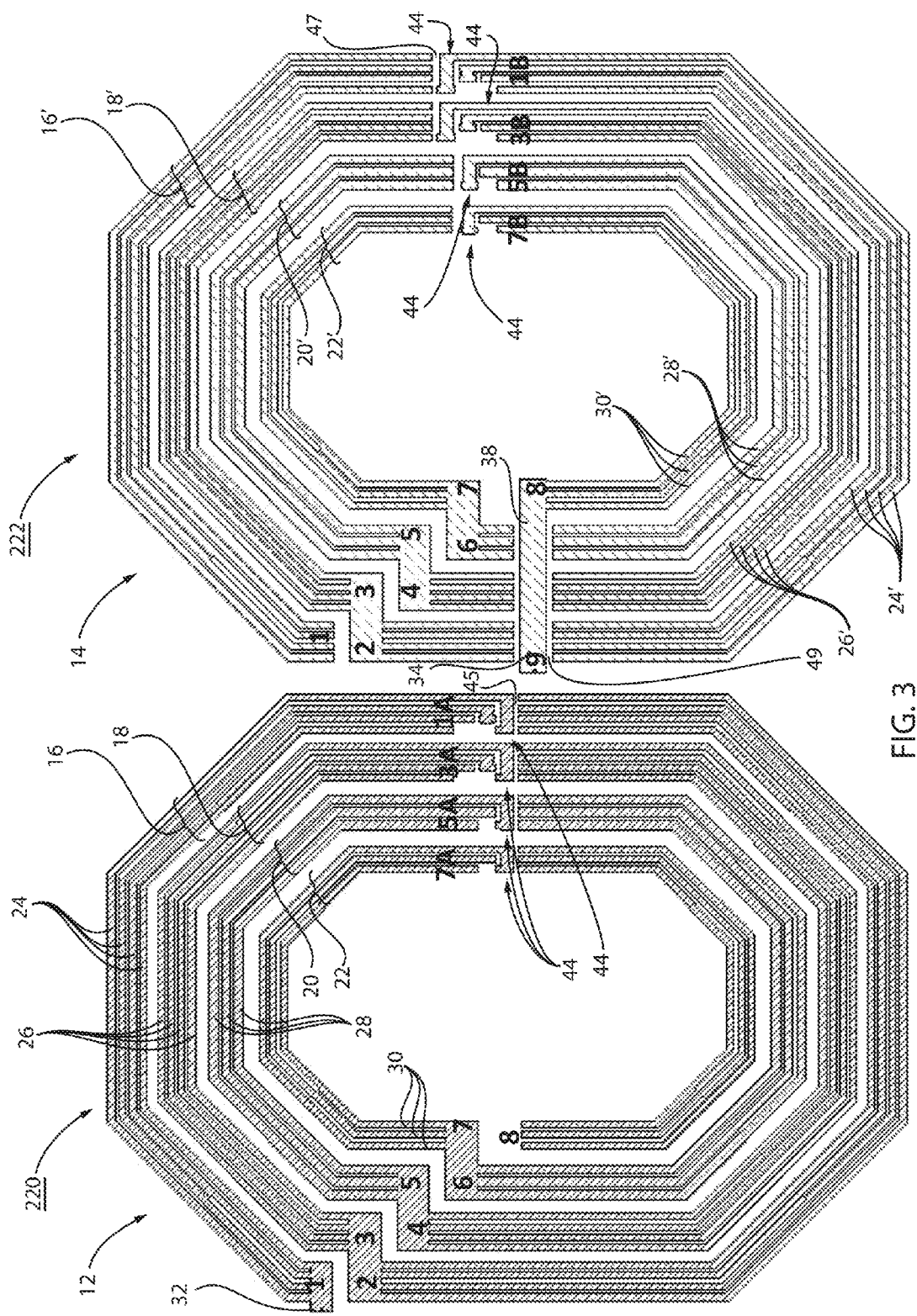
FIG. 3 is a layout view showing two spirals and interlevel connection points where cross-over architectures are employed therebetween in accordance with the present principles.

Referring to FIG. 3, a layout view is shown for a top spiral 220 (level 12) and a bottom spiral 222 (level 14) in accordance with an illustrative embodiment. The layout view shows an example of corresponding layers of a two level structure; however, it should be understood that additional levels may be employed, and the additional levels may include cross-over architectures to maintain common lengths between segments. The segments in such a case may be pairs, triplets, quadruplets, etc. that extend between two, three, four, etc. levels. In the top spiral 220, a first connection point 1 connects to a point 2, point 3, point 4, point 5, point 6, point 7 and point 8 on both levels 12 and 14. Both levels are connected throughout their turns using vias (not shown), and are connected to establish equal path length at cross-over architectures 44. The cross-over architectures 44 are shown split between the two levels 12 and 14.

Beginning at first inductor node 32, the connection points 1 on level 12 and level 14 are connected together until a break area 47 on level 14, then cross-over architecture 44 connects segments 24 to segments 24' between connection points 1A and 1B across break area 47 on level 14 using the equal path length connections schemes in accordance with the present principles. The segments 24' and 24 are connected until break area 49 on level 14. Break area 49 is provided to accommodate a cross-over connection 38. Segments 24 bridge over the break area 49 continuing the connection to connection point 2 on levels 12 and 14. At connection point 2, the radius of the next turn is decreased. To make the connection between points 2 and 3 on the next turn, a turn-to-turn connection is needed. FIGS. 4A-4D show four illustrative possibilities for making the turn to turn connection at points 2 and 3.

The connection points 3 on level 12 and level 14 are connected together until a break area 47 on level 14, then cross-over architecture 44 connects segments 26 to segments 26' between connection points 3A and 3B across break area 47 on level 14 using the equal path length connections schemes in accordance with the present principles. The segments 26' and 26 are connected until break area 49 on level 14. Break area 49 is provided to accommodate the cross-over connection 38. Segments 26 bridge over the break area 49 continuing the connection to connection point 4 on levels 12 and 14, at which point another turn-to-turn connection point (FIGS. 4A-4D) connects point 4 to point 5 on the next smaller radius turn.

The connection points 5 on level 12 and level 14 are connected together until a break area 47 on level 14, then cross-over architecture 44 connects segments 28 to segments 28' between connection points 5A and 5B across break area 47 on level 14 using the equal path length connections schemes in accordance with the present principles. The segments 28' and 28 are connected until break area 49 on level 14. Break area 49 is provided to accommodate the cross-over connection 38. Segments 28 bridge over the break area 49 continuing the connection to connection point 6 on levels 12 and 14, at which point another turn-to-turn connection point (FIGS. 4A-4D) connects point 6 to point 7 on the next smaller radius turn.

The connection points 7 on level 12 and level 14 are connected together until a break area 47 on level 14, then cross-over architecture 44 connects segments 30 to segments 30' between connection points 7A and 7B across break area 47 on level 14 using the equal path length connections schemes in accordance with the present principles. Note that three segments (30, 30') are present for each level instead of the two depicted in FIG. 1). The segments 30' and 30 are connected to connection point 8 on level 14. Connection point 8 on both levels connects to connection point 9 on level 14. Connection point 9 is the second inductor node 34.

Figure 4A:
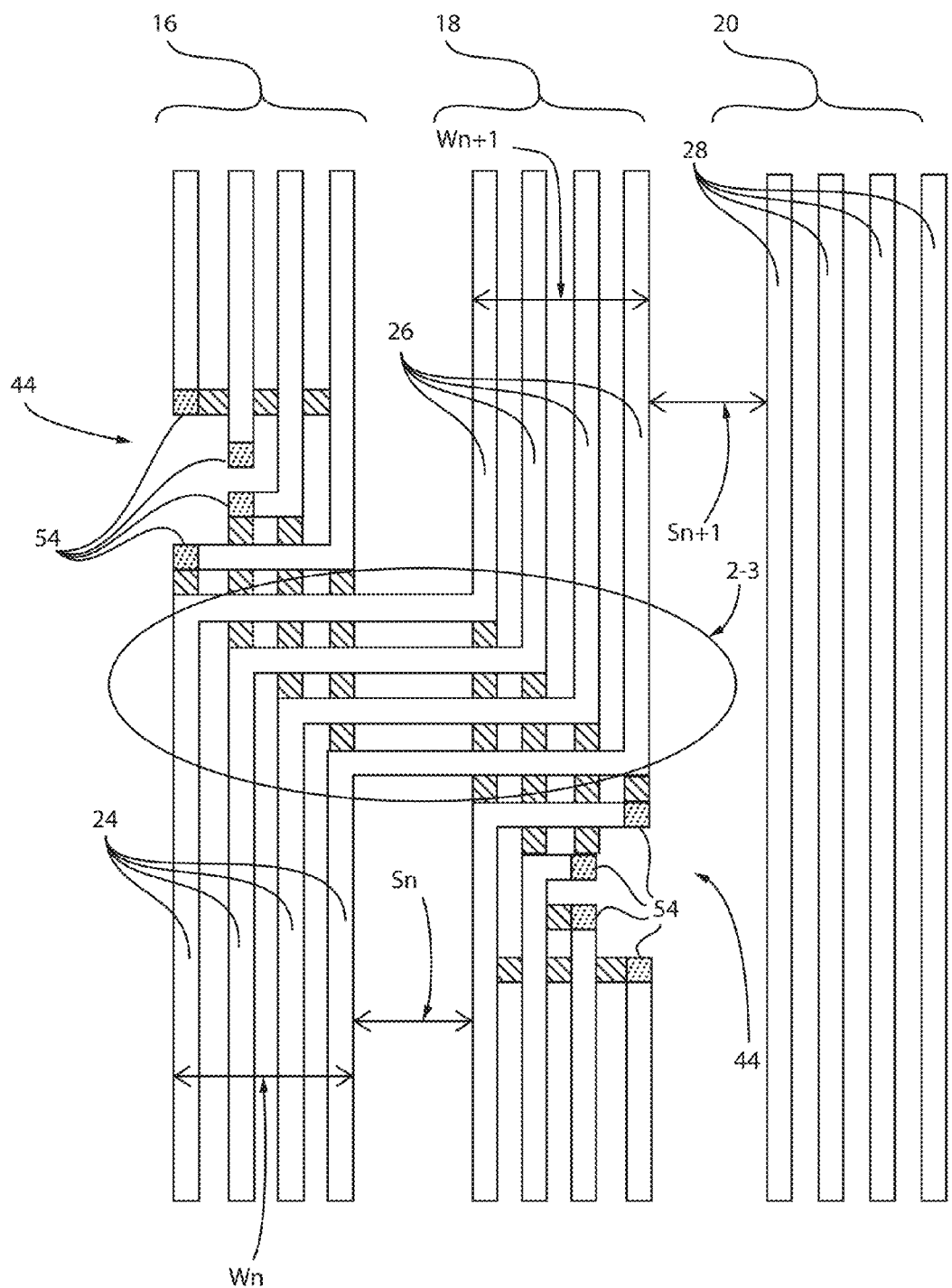
FIG. 4A is a partial layout view showing a turn-to-turn connection where the number of segments between turns is equal in accordance with the present principles.
Figure 4B:
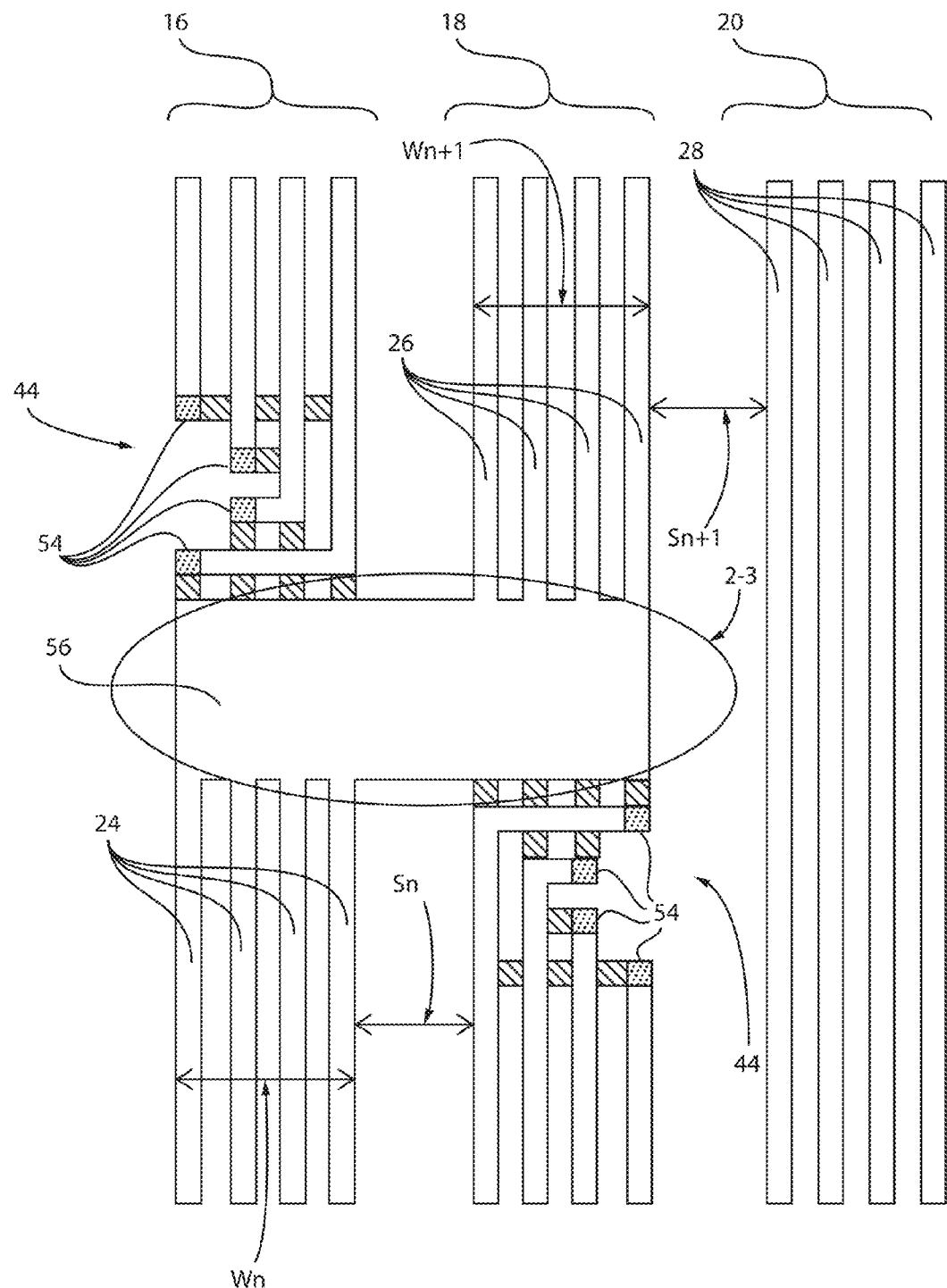
FIG. 4B is a partial layout view showing a turn-to-turn connection where the number of segments between turns is equal and connected in a block in accordance with the present principles.

Referring to FIGS. 4A-4D, turn-to-turn connections will be described in greater detail in accordance with four illustrative examples. The turn-to-turn connections occur, e.g., between points 2 and 3 (2-3), 4 and 5 (4-5), 6 and 7 (6-7) in FIG. 3. FIG. 4A shows the case where the number of segments (equal to 4) is the same between the turns before and after turn-to-turn connections occur between connection points 2 and 3 (2-3). The segments 24 continue through the connection to segments 26. A width of turn 16 is indicated as Wn and the width of turn 18 is indicated as Wn+1. Similarly, a space between turn 16 and turn 18 is indicated as Sn and the next space between turn 18 and turn 20 is indicated as Sn+1. Nearby cross-over architectures 44 are shown with vias 54 connecting layer 12 to layer 14. FIG. 4B shows the same case, but the segments are all shorted together (formed in a block 56) as they make the turn-to-turn connection.

Figure 4C:
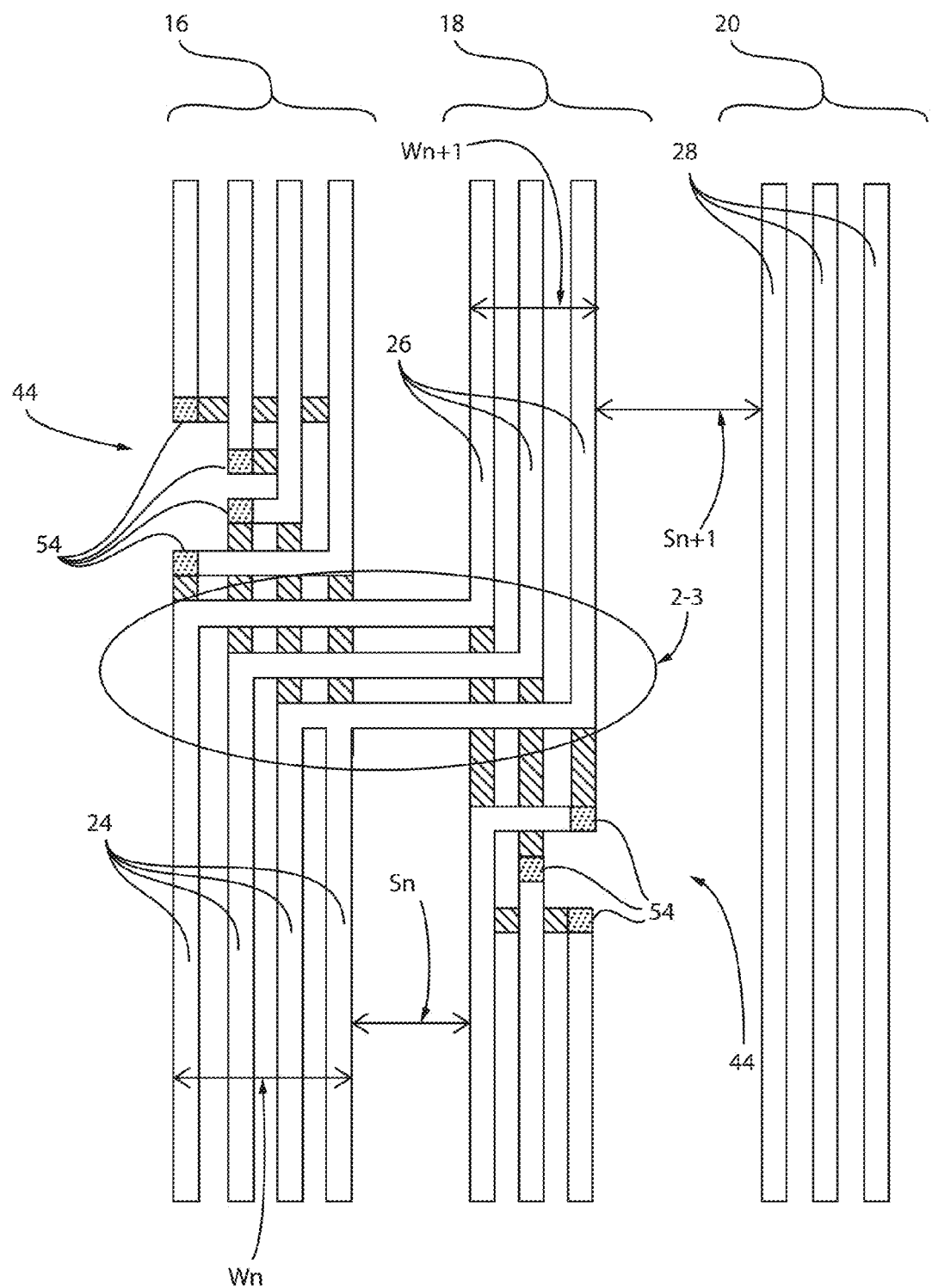
FIG. 4C is a partial layout view showing a turn-to-turn connection where the number of segments between turns is not equal in accordance with the present principles.
Figure 4D:
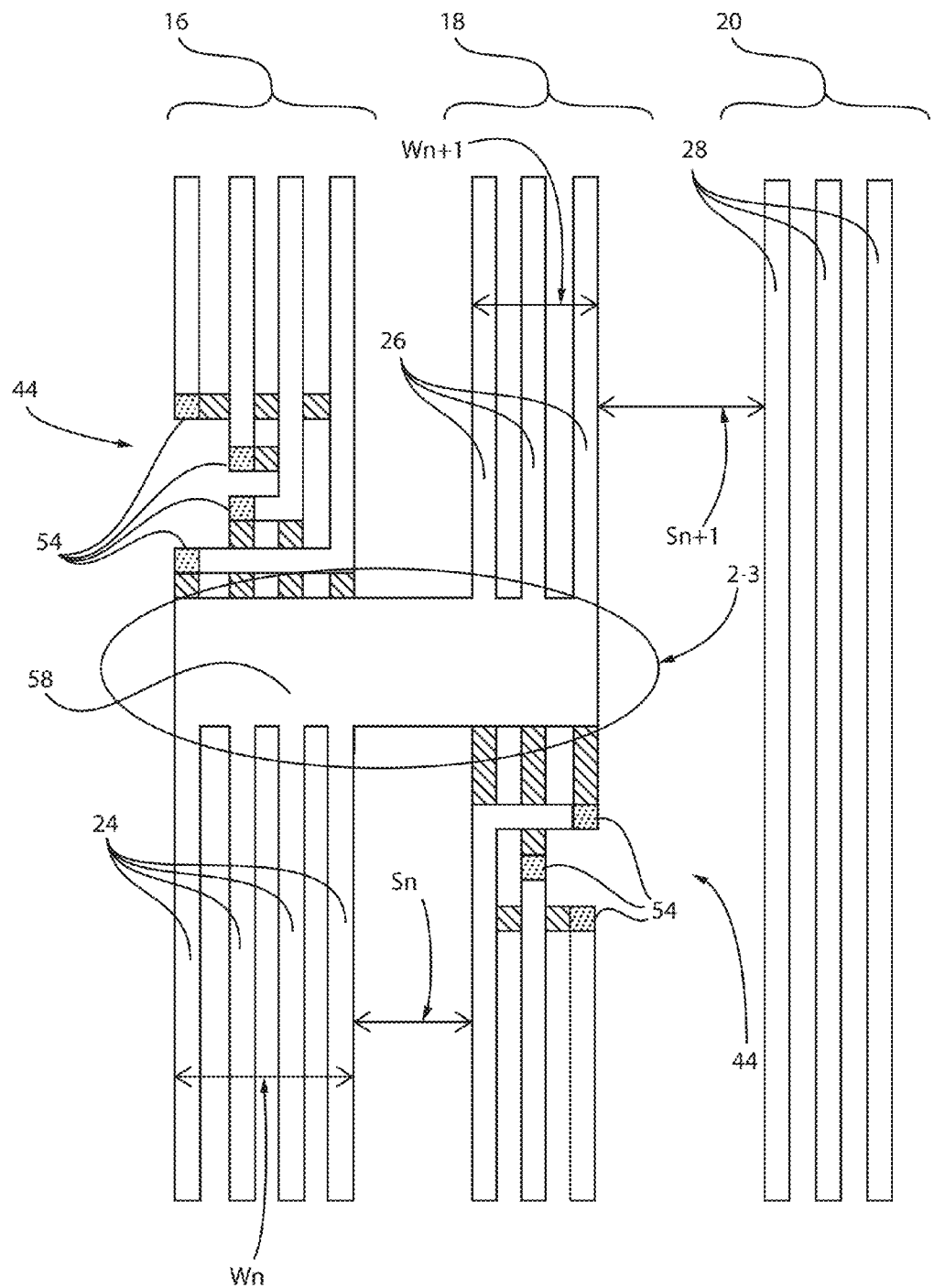
FIG. 4D is a partial layout view showing a turn-to-turn connection where the number of segments between turns is not equal and the segments are connected in a block in accordance with the present principles.

FIG. 4C shows the case where the number of segments is reduced in the next adjacent turn following connection point 2-3. This causes the turn width of the following turn to decrease from Wn to Wn+1 and the turn-to-turn space to increase from Sn to Sn+1. FIG. 4D shows the same case, but the segments are all shorted together to form block 58 as they make the turn-to-turn connection.

Figure 5:
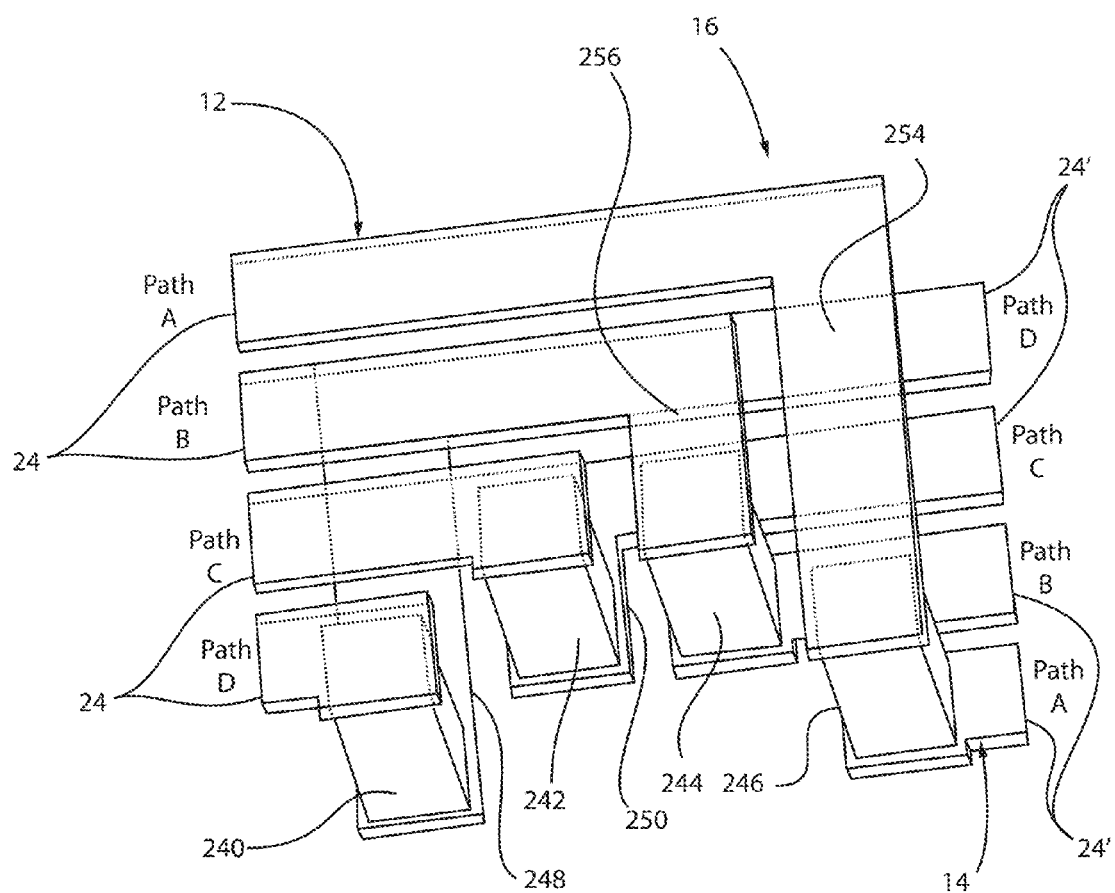
FIG. 5 is a perspective view of a cross-over architecture in accordance with the present principles.

Referring to FIG. 5, a cross-over point or architecture 44 is shown for the outer turn 16 (four segments 24) as described with reference to FIG. 1. Segments 24 of turn 16 on level 12 are connected to segments 24' of turn 16' on level 14. The innermost segment 24 connects to the outermost segment 24' through a lateral extension 254 and a via 246 to form path A. Path B includes an inner intermediary segment 24 connected to an outer intermediary segment 24' by a lateral extension 256 and a via 244. Path C includes an outer intermediary segment 24 connected to an inner intermediary segment 24' by a via 242 and a lateral extension 250. Path D includes an outer segment 24 connected to an inner segment 24' by a via 240 and a lateral extension 248.

By employing, the cross-over architecture including vias, extensions and segment lengths, segment pairs for a given turn are equal in length. For example, a length of path A=length of path B=length of path C=length of path D.

Referring to FIGS. 6A-6C, cross-sections of a 3D inductor structure are shown having an upper layer 302 and a lower layer 304 with connecting vias (not shown). The layers 302 and 304 comprise segment pairs as described above to equalize the current flow through each segment. Each segment pair is connected using the cross-over architecture (not shown) described above using multiple metal levels to enable lateral connection of segments without shorting segments together. For example, each spiral turn 306 is divided into multiple segments 308 through the two or more vertical layers 302, 304, which are electrically connected in parallel vertically throughout their length with vias, with the number of segments being reduced from outer turn to inner turn. The layers 302 and 304 in FIGS. 6A-6C have corresponding geometries.

In FIG. 6A, a total width or the diameter of the spiral turns 306 and/or segments 308 may be reduced or increased at a constant rate or any other monotonic rate (including periodically constant) as the radius is reduced or increased relative to a center portion of a coil 311. In one embodiment, the segments vary in size and number as a function of radial distance from a center region.

In FIG. 6B, spaces 310 between each consecutive spiral turns and/or segments 308 may be increased or reduced at a constant rate or any other monotonic rate (including periodically constant) as the radius is reduced or increased relative to a center portion of the coil 311.

The spacings and widths (size) of turns or segments can be modified as desired. For example, the spacing between segments within a turn can be increased while the total turn width can be decreased, maintaining a constant low frequency inductance and resistance, to further minimize current crowding effects.

In FIG. 6C, one or more vertically adjacent metal layers 315 can be connected in parallel to the upper or lower spirals to decrease series resistance. The additional metal layer may include an increased thickness, an additional patterned metal layer in contact with the upper or lower spirals, or interlevel connects (interconnects or vias) connecting one or more additional spiral layers. The number of metal layers connected in parallel across the turns may be varied for highest performance at a given frequency. Each of the above adjustments, sizes, spacings, etc. may be employed to advantage in attempting to achieve high performance requirements for many applications. The 3D inductor structure includes parallel stacking (for lower DC resistance), multipath architecture with cross-overs for equal path length (reduces skin effect and proximity effect losses), variable segments within each turn (further reduces proximity effect losses), etc.

Figure 7A:
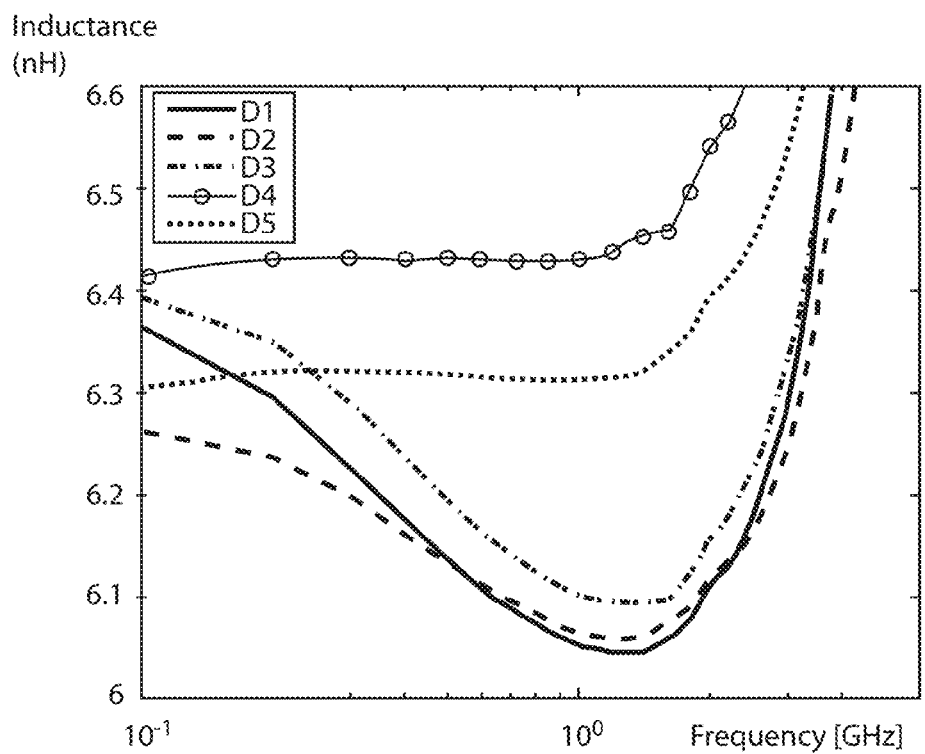
FIG. 7A is a graph of inductance (nH) versus frequency (GHz) for five inductor structures showing improved inductor characteristics in accordance with the present principles.

Referring to FIG. 7A, a graph of inductance (nH) versus frequency (GHz) is plotted for five inductor structures. These structures include: D1—a conventional parallel stacked inductor (Width (W)=25 microns, Space (S)=5 microns, N=4, Area=330×500 microns$^2$); D2—a conventional parallel stacked inductor with a varied width and space (W=25 microns, 15 microns, S=5 microns, 10 microns, N=4, Area=330×500 microns$^2$); D3—slotted parallel stacked inductor without cross-overs and equal path length architecture (W=25 microns, S=5 microns, N=4, Area=330×500 microns$^2$); D4—a parallel stacked inductor with equal path length cross-over architecture in accordance with the present principles (W=25 microns, S=5 microns, N=4, Area=330×500 microns$^2$); and D5—a parallel stacked inductor with equal path length cross-over architecture in accordance with the present principles, and varied width and space (W=25 microns, 15 microns, S=5 microns, 10 microns, N=4, Area=330×500 microns). The D4 and D5 structures provide a steady inductance value over a large frequency range.

Figure 7B:
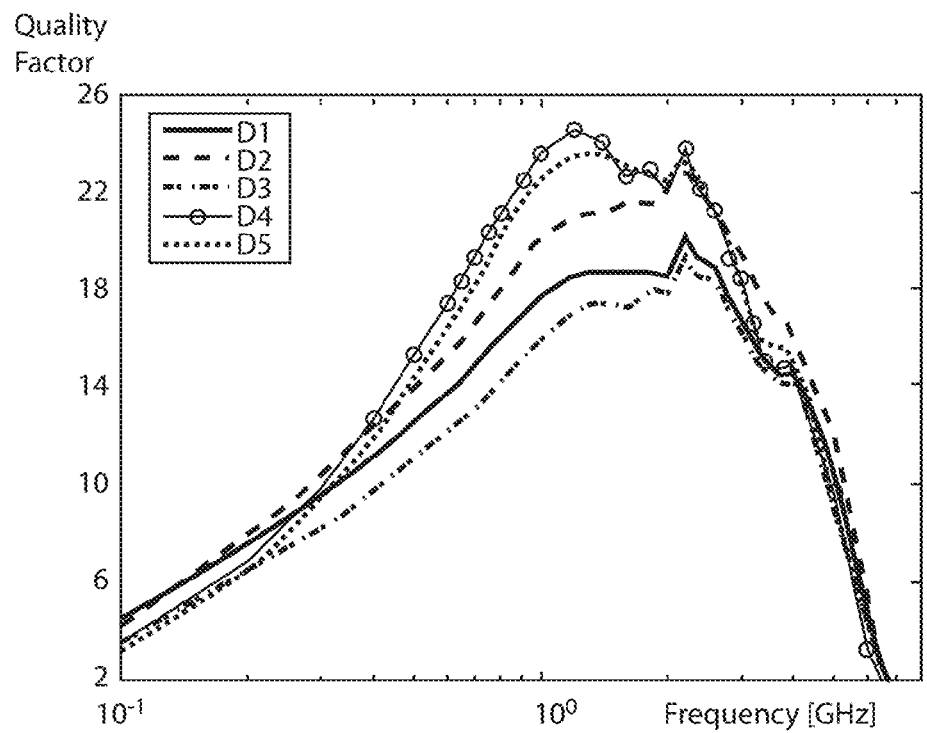
FIG. 7B is a graph of quality factor versus frequency (GHz) for five inductor structures showing improved quality factor in accordance with the present principles.

Referring to FIG. 7B, a graph of quality factor versus frequency (GHz) is plotted for the five inductor structures described above. These structures were formed using a four layer metal stack on a silicon-on-insulator (SOI) substrate. The quality factor for the D4 and D5 structures in accordance with the present principles is higher than the other structures and remains so over a larger frequency range.

The structures in accordance with the present principles provide a higher quality factor with a stable inductance, and measured results support these improvements in inductor performance. The 3D inductor structure in accordance with the present principles provides a parallel stacked winding that provides lower DC resistance, includes a multipath architecture with cross-overs for equal path length to reduce skin effect and proximity effect losses and includes variable segments within each turn (segment pairs) to further reduce proximity effect losses. Structure in accordance with the present principles may be implemented with all back end of the line (BEOL) processing options. The inductor structure may be employed in any semiconductor device or chip that includes or needs an inductor and, in particularly useful embodiments, the present principles provide inductors for high frequency applications such as communications applications, e.g., in GSM and CDMA frequency bands, amplifiers, power transfer devices, etc.

Referring to FIG. 8, simulation results for current density are depicted for different inductor structures having varying segment numbers. The current density plots show an inductor 402 having a single parallel path (L1), an inductor 404 having a double parallel path (two parallel segments having equal path length) (L2) and an inductor 406 having a four parallel paths (four segments having equal path length) (L4). An intensity scale 408 shows an intensity spectrum for the current density in the structures. The structures simulated in the current density plots of FIG. 8 are also simulated in the graphs of FIGS. 9A and 9B.

Referring to FIGS. 9A and 9B, graphs show simulated results for segment number variations in the parallel inductor structures. L1, L2, L3 and L4 respectively represent a single parallel path, double parallel path, triple parallel path and quadruple parallel path. For example, the number of segments varies from 1 to 4.

FIG. 9A is a graph of simulated inductance (nH) versus frequency (GHz) plotted for inductor structures L1, L2, L3 and L4. FIG. 9B is a graph of simulated quality factor versus frequency (GHz) plotted for inductor structures L1, L2, L3 and L4. When the number of individual strands or paths increases, current crowding is suppressed to that extent and the quality factor increases. The measured and simulated results shown in FIGS. 7A, 7B, 8, 9A and 9B demonstrate significant improvements in accordance with the present principles to overall inductor performance and in particular for quality factor.

Figure 10:
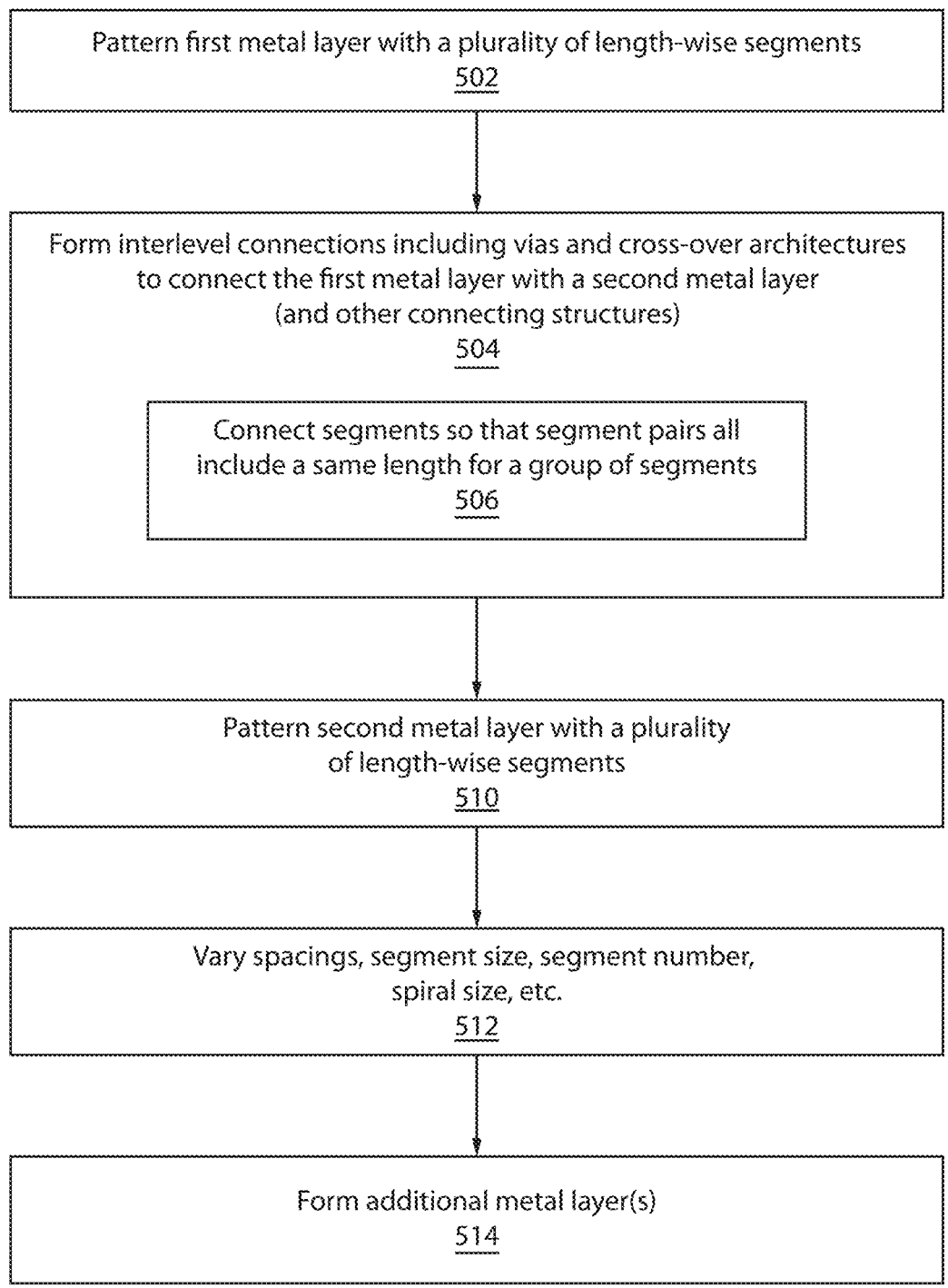
FIG. 10 is a block/flow diagram showing a method for fabricating a parallel stacked multipath inductor in accordance with illustrative embodiments.

Referring to FIG. 10, a method for fabricating a parallel stacked multipath inductor is shown in accordance with illustrative embodiments. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 502, a first metal layer is patterned to form spiral turns about a center region. The patterning process may employ any known process including lithographic masking and etching, lithographic trench formation, metal deposition and chemical mechanical planarization, etc. The spiral turns include two or more segments that extend length-wise along the turns and have positions that vary from an innermost position relative to the center portion and an outermost position relative to the center portion. In block 504, inter-level connections are made between metal layers. This includes forming vias to connect sections of spiral turns between the first metal layer and a second metal layer. Cross-over architectures are formed and configured to couple the segments of the first layer to the segments of the second layer to form segment paths that have a substantially same length for all segment paths between the first layer and the second layer. One or more cross-over architectures may be employed per turn. The cross-over architectures may be formed by via connections (and/or other structures, e.g., extensions, bars, connection lines, etc.) may be formed through a dielectric layer. The dielectric layer may be deposited over the first metal layer and via holes may be opened up to connect to segments as described above.

Forming at least one cross-over architecture includes forming segment pairs between layers that have a substantially same length in block 506. This may be achieved by connecting a segment on the first layer at an innermost position to a segment on the second layer at an outermost position, and a segment on the first layer at an outermost position to a segment on the second layer at an innermost position. If present, a segment on the first layer is connected at an inner intermediary position to a segment on the second layer at an outer intermediary position, and a segment on the first layer at an outer intermediary position is connected to a segment on the second layer at an inner intermediary position.

In block 510, the second metal layer is patterned to form spiral turns about the center region and is vertically offset from the first metal layer. The patterning may include any known process. The spiral turns include two or more segments that extend length-wise along the turns and have positions that vary from an innermost position relative to the center portion and an outermost position relative to the center portion, the first layer and the second layer including corresponding segment numbers therebetween.

Note that the shape and geometry, such as, spiral size, turn spacings, segment size or number (e.g., thickness/widths or number of segments in a turn, etc.) may be varied in block 512. For example, the first metal layer or the second metal layer may be patterned to include a segment number that varies with distance from the center region.

In block 514, additional layers or structure (vias, extensions, connections, etc.) may be added and connected by cross-over architectures or be included by connections to increase conductive cross-section and reduce resistance.

Having described preferred embodiments for a parallel stacked multipath inductor (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A parallel stacked multipath inductor, comprising:
a first layer including a plurality of turns disposed about a center region, each turn in the plurality of turns on the first layer having two or more segments that extend length-wise along the turns, the segments having positions that vary from an innermost position within each turn on the first layer relative to the center region to an outermost position within each turn on the first layer relative to the center region;

a second layer including a plurality of turns electrically connected to the first layer along its length and disposed about the center region, each turn in the plurality of turns on the second layer having two or more segments that extend length-wise along the turns, the segments having positions that vary from an innermost position within each turn on the second layer relative to the center region to an outermost position within each turn on the second layer relative to the center region; and one or more cross-over architectures configured to couple the segments of each turn on the first layer with the segments of each corresponding turn on the second layer to form segment paths that have a same length for all segment paths per turn between the first and second layers.

2. The inductor as recited in claim 1, wherein the one or more cross-over architectures includes a connection between the two or more segments such that a segment within a first turn of the plurality of turns on the first layer at an innermost position within the first turn is connected to a segment within a corresponding turn of the plurality of turns on the second layer at an outermost position within the corresponding turn, and a segment within the first turn on the first layer at an outermost position within the first turn is connected to a segment within the corresponding turn on the second layer at an innermost position within the corresponding turn.

3. The inductor as recited in claim 1, wherein the two more segments includes at least four segments, wherein the one or more cross-over architectures include a connection between the two or more segments such that a segment within a first turn of the plurality of turns on the first layer at an inner intermediary position within a first turn is connected to a segment within a corresponding turn of the plurality of turns on the second layer at an outer intermediary position within the corresponding turn, and a segment within the first turn on the first layer at an outer intermediary position within the first turn is connected to a segment within the corresponding turn on the second layer at an inner intermediary position within the corresponding turn.

4. The inductor as recited in claim 1, wherein the two or more segments includes at least three segments, wherein the one or more cross-over architectures include a connection between the two or more segments such that a middle segment within a first turn within the plurality of turns on the first layer is connected to a middle segment within a corresponding turn within the plurality of turns on the second layer.

5. The inductor as recited in claim 1, wherein the one or more cross-over architectures include lateral extensions and vias to form connections between the two or more segments.

6. The inductor as recited in claim 1, wherein the one or more cross-over architectures include one or more cross-over architectures per turn to equalize current flow through each segment.

7. The inductor as recited in claim 1, wherein the turns in the plurality of turns on the first layer and the turns in the plurality of turns on the second layer include a width that varies with distance from the center region.

8. The inductor as recited in claim 1, wherein the turns in the plurality of turns on the first layer and the turns in the plurality of turns on the second layer include a spacing that varies with distance from the center region.

9. The inductor as recited in claim 1, wherein the turns in the plurality of turns on the first layer and the turns in the plurality of turns on the second layer include a segment number that varies with distance from the center region.

10. The inductor as recited in claim 1, further comprising at least one additional layer coupled to one or more of the first layer and/or the second layer to reduce resistance.

11. A parallel stacked multipath inductor, comprising:
a first layer including a plurality of turns disposed about a center region, each turn in the plurality of turns on the first layer having two or more segments that extend length-wise along the turns, the segments having positions that vary from an innermost position within each turn on the first layer relative to the center region to an outermost position within each turn on the first layer relative to the center region;

a second layer including a plurality of turns electrically connected to the first layer by a plurality of via connections along its length and disposed about the center region, each turn in the plurality of turns on the second layer having two or more segments that extend length-wise along the turns, the segments having positions that vary from an innermost position within each turn on the second layer relative to the center region to an outermost position within each turn on the second layer relative to the center region, the turns within the plurality of turns on the first layer and the turns within the plurality of turns on the second layer including one or more of a width that varies with distance from the center region, a spacing that varies with distance from the center region and/or a segment number that varies with distance from the center region; and one or more cross-over architectures configured to couple the segments of each turn on the first layer with the segments of each corresponding turn on the second layer to form segment paths that have a same length for all segment paths per turn between the first and second layers.

12. The inductor as recited in claim 11, wherein the one or more cross-over architectures includes a connection between the two or more segments such that a segment within a first turn of the plurality of turns on the first layer at an innermost position within the first turn is connected to a segment within a corresponding turn of the plurality of turns on the second layer at an outermost position within the corresponding turn, and a segment within the first turn on the first layer at an outermost position within the first turn is connected to a segment within the corresponding turn on the second layer at an innermost position within the corresponding turn.

13. The inductor as recited in claim 11, wherein the two more segments includes at least four segments, wherein the one or more cross-over architectures include a connection between the two or more segments such that a segment within a first turn of the plurality of turns on the first layer at an inner intermediary position within a first turn is connected to a segment within a corresponding turn of the plurality of turns on the second layer at an outer intermediary position within the corresponding turn, and a segment on the first layer at an outer intermediary position within the first turn is connected to a segment within the corresponding turn on the second layer at an inner intermediary position within the corresponding turn.

14. The inductor as recited in claim 11, wherein the two or more segments includes at least three segments, wherein the one or more cross-over architectures include a connection between the two or more segments such that a middle segment within a first turn within the plurality of turns on the first layer is connected to a middle segment within a corresponding turn within the plurality of turns on the second layer.

15. The inductor as recited in claim 11, wherein the one or more cross-over architectures include lateral extensions and vias to form connections between the two or more segments.

16. The inductor as recited in claim 11, wherein the one or more cross-over architectures include one or more cross-over architectures per turn to equalize current flow through each segment.

17. The inductor as recited in claim 11, further comprising at least one additional layer coupled to one or more of the first layer and/or the second layer to reduce resistance.

\* \* \* \* \*